US012756380B2

(12) United States Patent
Cheng et al.

(10) Patent No.: US 12,756,380 B2
(45) Date of Patent: Oct. 6, 2026

(54) DUTY CYCLE SIGNAL PROCESSING CIRCUIT AND METHOD, AND AUDIO SIGNAL PROCESSING DEVICE

(71) Applicant: Shanghai awinic Technology Co., Ltd., Shanghai (CN)

(72) Inventors: Li Cheng, Shanghai (CN); Hao Ying, Shanghai (CN); Taotao Wang, Shanghai (CN); Qifan Zhang, Shanghai (CN); Haijun Zhang, Shanghai (CN)

(73) Assignee: Shanghai awinic Technology Co., Ltd., Shanghai (CN)

( * ) Notice: Subject to any disclaimer, the term of this patent is extended or adjusted under 35 U.S.C. 154(b) by 22 days.

(21) Appl. No.: 19/030,352

(22) Filed: Jan. 17, 2025

(65) Prior Publication Data

US 2025/0167771 A1 May 22, 2025

Related U.S. Application Data

(63) Continuation of application No. PCT/CN2023/085444, filed on Mar. 31, 2023.

(30) Foreign Application Priority Data

Oct. 20, 2022 (CN) ........................ 202211290657.7

(51) Int. Cl.
*H03K 3/017* (2006.01)
*H03K 5/24* (2006.01)

(52) U.S. Cl.
CPC ............... *H03K 3/017* (2013.01); *H03K 5/24* (2013.01)

(58) Field of Classification Search
CPC ................................ H03K 3/017; H03K 5/24
(Continued)

(56) References Cited

U.S. PATENT DOCUMENTS 3,900,823 A * 8/1975 Sokal .................. H03G 3/3042 330/297
8,013,677 B2 9/2011 Kaya et al.
2021/0367566 A1 11/2021 Mukhopadhyay et al.

FOREIGN PATENT DOCUMENTS

CN 106656065 A 5/2017
CN 111466082 A 7/2020
(Continued)

OTHER PUBLICATIONS

International Search report of PCT/CN2023/085444 issued by CNIPA on Jun. 21, 2023.

*Primary Examiner* — William Hernandez
(74) *Attorney, Agent, or Firm* — Che-Yang Chen; Law Office of Michael Chen

(57) ABSTRACT

The present disclosure discloses a duty cycle signal processing circuit and method, and an audio signal processing device. The duty cycle signal processing circuit includes an amplitude detector and an operation unit, where the amplitude detector is configured to detect a first amplitude of an audio signal, generate a second amplitude, and send the second amplitude to the operation unit; and the operation unit is configured to obtain a power supply voltage, and perform operation processing on the second amplitude and the power supply voltage, to obtain a duty cycle control signal that matches at least one parameter of the second amplitude and the power supply voltage. In the present disclosure, conversion efficiency of a corresponding power amplifier unit can be improved.

20 Claims, 7 Drawing Sheets

(58) Field of Classification Search
USPC .......................................................... 327/175
See application file for complete search history.

(56) References Cited

FOREIGN PATENT DOCUMENTS

| | | | |
|---|---|---|---|
| CN | 111970608 | A | 11/2020 |
| CN | 212392985 | U | 1/2021 |
| CN | 113054928 | A | 6/2021 |
| CN | 113691223 | A | 11/2021 |
| CN | 115473499 | A | 12/2022 |

* cited by examiner

DUTY CYCLE SIGNAL PROCESSING CIRCUIT AND METHOD, AND AUDIO SIGNAL PROCESSING DEVICE

CROSS-REFERENCE TO RELATED APPLICATIONS AND INCORPORATION BY REFERENCE

The present disclosure is a continuation of international application No. PCT/CN2023/085444, filed on Mar. 31, 2023, which claims priority to an invention application No. 202211290657.7, filed on Oct. 20, 2022, and entitled "DUTY CYCLE SIGNAL PROCESSING CIRCUIT AND METHOD, AND AUDIO SIGNAL PROCESSING DEVICE", both of which are incorporated herein by reference in their entireties.

TECHNICAL FIELD

The present disclosure relates to the field of circuit technologies, and in particular, to a duty cycle signal processing circuit and method, and an audio signal processing device.

BACKGROUND

A power amplifier unit such as a class-D power amplifier and a corresponding duty cycle signal processing circuit are important components of an audio signal processing device. It can be learned by using the class-D power amplifier as an example that the class-D power amplifier can be used in a pulse width modulation process of an audio signal. Compared with a conventional linear power amplifier, the class-D power amplifier has a characteristic of high conversion efficiency, so that not only the useful life of a power supply battery of a chip is prolonged, but also heat dissipation of the chip is small, and for operation of a high-power power amplifier chip, only a small heat sink or no heat sink is required, thereby reducing chip packaging costs. With continuous improvement of a chip manufacturing process and a circuit design level, the class-D power amplifier is increasingly close to the performance of a traditional linear power amplifier in audio quality, and is greatly welcomed in the audio power amplifier market.

An output stage of this type of power amplifier unit such as the class-D power amplifier consists of two complementary switching power transistors. Driven by a high-frequency control pulse, the power transistors operate in an on state, which is consistent with an operating principle of an inverter. One switching power transistor is on, and the other switching power transistor is off. Therefore, the switching power transistors operate without a static current and have high conversion efficiency. In theory, the efficiency of this type of power amplifier unit can reach 100%, but in practice, the conversion efficiency of the corresponding power amplifier unit is affected due to a power loss of on-resistors of the switching power transistors as well as the charging and discharging of an LC filter at an output terminal of a power amplifier.

SUMMARY

In view of this, the present disclosure provides a duty cycle signal processing circuit and method, and an audio signal processing device, to resolve a technical problem that a conventional solution affects conversion efficiency of a power amplifier unit.

A first aspect of the present disclosure provides a duty cycle signal processing circuit, including an amplitude detector and an operation unit;

- the amplitude detector is configured to detect a first amplitude of an audio signal to generate a second amplitude, and send the second amplitude to the operation unit; and
- the operation unit is configured to obtain a power supply voltage, and perform operation processing on the second amplitude and the power supply voltage, to obtain a duty cycle control signal that matches at least one parameter of the second amplitude and the power supply voltage.

Optionally, the operation unit is further configured to obtain a theoretical duty cycle according to a preset condition, and determine the duty cycle control signal based on the theoretical duty cycle and an expected duty cycle level.

Optionally, the preset condition may include an operational formula:

$$DPWM*VSUP=V\text{amp\_out}+VHR.$$

Wherein, DPWM represents the theoretical duty cycle, VSUP represents the power supply voltage, Vamp_out represents the second amplitude, and VHR represents an amplitude margin.

Optionally, the operation unit includes a comparison subunit and a transcoder. The comparison subunit is configured to compare the second amplitude with each of a plurality of comparison thresholds, and output comparison results to the transcoder, where the comparison thresholds are determined respectively based on the power supply voltage, the amplitude margin, and the duty cycle level, so that duty cycle control signals corresponding to the comparison thresholds match at least one parameter of the second amplitude and the power supply voltage. The transcoder is configured to transcode the comparison results to obtain duty cycle control signals corresponding to the comparison results.

Optionally, the comparison subunit includes a first comparator, a second comparator, a third comparator, and a fourth comparator, and the comparison thresholds include a first threshold, a second threshold, a third threshold, and a fourth threshold. A first input terminal of the first comparator is configured to receive the second amplitude, a second input terminal of the first comparator is configured to receive the first threshold, and an output terminal of the first comparator is connected to a first input terminal of the transcoder; a first input terminal of the second comparator is configured to receive the second amplitude, a second input terminal of the second comparator is configured to receive the second threshold, and an output terminal of the second comparator is connected to a second input terminal of the transcoder; a first input terminal of the third comparator is configured to receive the second amplitude, a second input terminal of the third comparator is configured to receive the third threshold, and an output terminal of the third comparator is connected to a third input terminal of the transcoder; and a first input terminal of the fourth comparator is configured to receive the second amplitude, a second input terminal of the fourth comparator is configured to receive the fourth threshold, and an output terminal of the fourth comparator is connected to the fourth input terminal of the transcoder.

Optionally, the expected duty cycle level includes a first duty cycle, a second duty cycle, a third duty cycle, and a fourth duty cycle;

the first threshold includes: $VT1=A1\times VSUP-VHR$;

the second threshold includes: $VT2=A2\times VSUP-VHR$;

the third threshold includes: VT3=A3×VSUP−VHR; and the fourth threshold includes: VT4=A4×VSUP−VHR, wherein VT1 represents the first threshold, A1 represents the first duty cycle, VT2 represents the second threshold, A2 represents the second duty cycle, VT3 represents the third threshold, A3 represents the third duty cycle, VT4 represents the fourth threshold, and A4 represents the fourth duty cycle.

Optionally, the duty cycle signal processing circuit further includes a common-mode voltage control unit. An input terminal of the common-mode voltage control unit is connected to an output terminal of the operation unit, and is configured to perform operation processing based on the duty cycle control signal, to obtain a common-mode voltage corresponding to the duty cycle control signal.

Optionally, the common-mode voltage control unit includes a voltage divider subunit and a multiplexer. The voltage divider subunit is configured to perform a plurality of times of voltage division processing on a connected reference voltage, to obtain voltage division signals corresponding to the plurality of times of voltage division processing; and a control terminal of the multiplexer is configured to receive the duty cycle control signal, and selects a corresponding voltage output channel based on the duty cycle control signal, to output a corresponding common-mode voltage.

Optionally, the voltage divider subunit includes a first resistor, a second resistor, a third resistor, a fourth resistor, a fifth resistor, and a sixth resistor. A first terminal of the first resistor is connected to the reference voltage, and a second terminal of the first resistor is separately connected to a first terminal of the second resistor and a first input terminal of the multiplexer; a second terminal of the second resistor is separately connected to a first terminal of the third resistor and a second input terminal of the multiplexer; a second terminal of the third resistor is separately connected to a first terminal of the fourth resistor and a third input terminal of the multiplexer; a second terminal of the fourth resistor is separately connected to a first terminal of the fifth resistor and a fourth input terminal of the multiplexer; a second terminal of the fifth resistor is separately connected to a first terminal of the sixth resistor and a fifth input terminal of the multiplexer; and a second terminal of the sixth resistor is grounded.

Optionally, the duty cycle signal processing circuit further includes an analog-to-digital converter. The analog-to-digital converter is configured to obtain the power supply voltage, convert the power supply voltage into a digital signal, and then output the converted power supply voltage to the operation unit.

The present disclosure further provides a duty cycle signal processing method, applied to any one of the foregoing duty cycle signal processing circuits, including:

detecting a first amplitude of an audio signal to generate a second amplitude; and obtaining a power supply voltage, and performing operation processing on the second amplitude and the power supply voltage, to obtain a duty cycle control signal that matches at least one parameter of the second amplitude and the power supply voltage.

Optionally, the method of performing operation processing on the second amplitude and the power supply voltage, to obtain a duty cycle control signal that matches at least one parameter of the second amplitude and the power supply voltage further includes: obtaining a theoretical duty cycle according to a preset condition, and determining the duty cycle control signal based on the theoretical duty cycle and an expected duty cycle level.

Optionally, the preset condition may include an operational formula:

$$DPWM*VSUP=V\text{amp\_out}+VHR.$$

Wherein, DPWM represents the theoretical duty cycle, VSUP represents the power supply voltage, Vamp_out represents the second amplitude, and VHR represents an amplitude margin.

Optionally, the method of performing operation processing on the second amplitude and the power supply voltage, to obtain a duty cycle control signal that matches at least one parameter of the second amplitude and the power supply voltage further includes: comparing the second amplitude with each of a plurality of comparison thresholds, and outputting comparison results to the transcoder, where the comparison thresholds are determined respectively based on the power supply voltage, the amplitude margin, and the duty cycle level, so that duty cycle control signals corresponding to the comparison thresholds match at least one parameter of the second amplitude and the power supply voltage; and transcoding the comparison results, to obtain duty cycle control signals corresponding to the comparison results.

Optionally, the duty cycle signal processing method further includes: performing operation processing based on the duty cycle control signal, to obtain a common-mode voltage corresponding to the duty cycle control signal.

The present disclosure further provides an audio signal processing device, including an audio processing unit, a power amplifier unit, a driver, and any one of the foregoing duty cycle signal processing circuits, where the audio processing unit is configured to perform first modulation processing on a connected audio signal to obtain a first modulation signal, and send the first modulation signal to the power amplifier unit;

the power amplifier unit is configured to receive the first modulation signal and a common-mode voltage that is output by the duty cycle signal processing circuit, perform second modulation processing on the common-mode voltage based on the first modulation signal to obtain a second modulation signal, and send the second modulation signal to the driver; and the driver is configured to drive a corresponding play component based on the second modulation signal to play the audio signal.

Optionally, the audio processing unit includes a delayer, a DSM modulator, and a digital-to-analog converter. The delayer is configured to perform delay processing on the audio signal, and output a delayed audio signal to the DSM modulator; the DSM modulator is configured to perform DSM modulation on the delayed audio signal, to output an initial modulation signal; and the analog-to-digital converter is configured to perform digital-to-analog conversion on the initial modulation signal, to output the first modulation signal.

Optionally, the power amplifier unit includes a PWM modulator; and the PWM modulator is configured to perform the second modulation processing on the common-mode voltage, to obtain the second modulation signal.

Optionally, the power amplifier unit further includes an integrator; and the integrator is configured to receive the first modulation signal and the common-mode voltage, perform filtering processing on the common-mode voltage based on the first modulation signal, and output a filtered common-mode voltage to the PWM modulator.

Optionally, the audio signal processing device further includes a play component, and the play component is connected to an output terminal of the driver.

In the duty cycle signal processing circuit and method, and the audio signal processing device provided in the present disclosure, an amplitude detector can send a second amplitude corresponding to an audio signal amplitude to an operation unit, so that the operation unit performs operation processing on the second amplitude and a power supply voltage, to obtain a duty cycle control signal that matches at least one parameter of the second amplitude and the power supply voltage, and then a power amplifier unit such as a class-D power amplifier unit performs a driving operation based on the duty cycle control signal, where the duty cycle control signal matches at least one parameter of the second amplitude and the power supply voltage, so that the power amplifier unit can adaptively adjust a common-mode duty cycle in the power amplifier unit based on at least one parameter of the audio signal amplitude and the power supply voltage. When the signal amplitude is relatively low or in an idle state, the common-mode duty cycle correspondingly decreases, a corresponding on time of a switch is shortened, and a static power loss of an on-state resistor and a power loss of LC charging and discharging therein are reduced, so that conversion efficiency of the power amplifier unit can be improved, and driving power consumption can be reduced, thereby reducing power consumption of the entire audio signal processing device without causing audio signal distortion.

BRIEF DESCRIPTION OF DRAWINGS

To describe technical solutions in embodiments of the present disclosure more clearly, the following briefly describes accompanying drawings for describing the embodiments. It is clear that the accompanying drawings in the following description show merely some embodiments of the present disclosure, and those skilled in the art may still derive other accompanying drawings from these accompanying drawings without creative efforts.

DETAILED DESCRIPTION

The inventor studied audio processing devices of power amplifier units such as sampling class-D power amplifiers, and found that some solutions use a BD modulation mode, and use pulse width modulation (e.g., PWM) and triangular wave (or sawtooth) waveform generators or oscillators to encode audio input signals. BD modulation modulates a duty cycle of a difference between output signals, so that average content of the output signals corresponds to an input analog signal. The BD modulation provides, to some extent, superior audio performance (e.g., reduced pops and ticks). However, when a low-pass (LC) filter is used, the BD modulation without an audio signal (or with a low level) has much higher power consumption than that of other common modulation technologies (e.g., AD modulation). The BD modulation has significant common-mode content in its output. Thus, there is correlation between a common-mode duty cycle, an inductor current ripple, and power consumption. The power consumption is the highest when the common-mode duty cycle is or approximates to fifty percent (50%), because the ripple current is maximized under this duty cycle. In this solution, when a level of an analog input signal is lower than a threshold level, the common-mode duty cycle is 50%. When the level of the analog input signal is lower than the threshold level, a modulator shifts a common-mode duty cycle of each of a first quantization signal and a second quantization signal, so that the common-mode duty cycle is greater than or less than fifty percent (50%). In this manner, the power consumed by a load (e.g., a speaker) is correspondingly reduced, thereby improving efficiency of a power amplifier to some extent. However, an improvement effect is limited.

Figure 1:
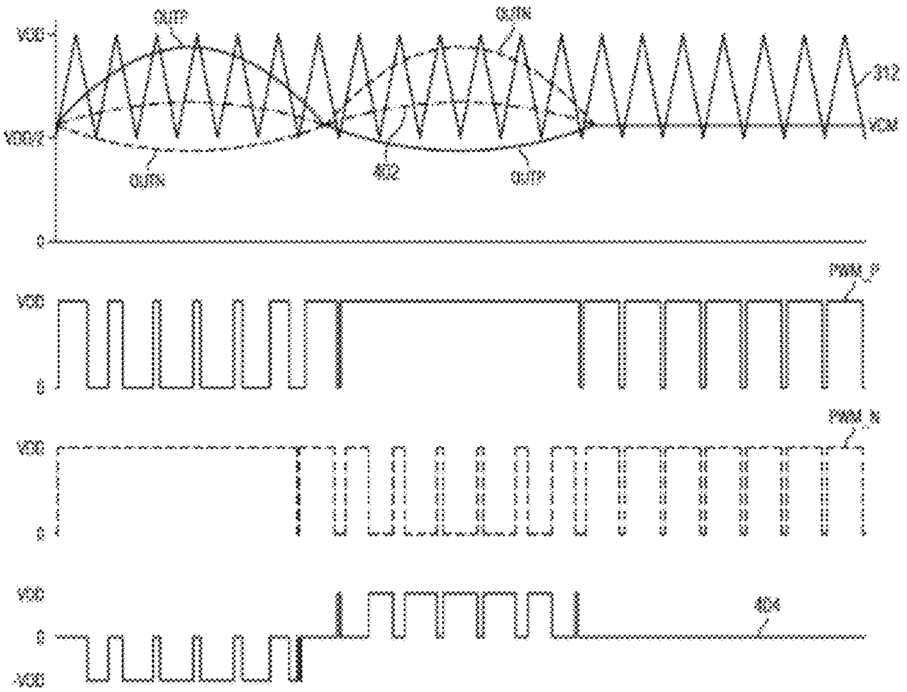
FIG. 1 is a waveform diagram related to an inventor's research solution.

The inventor also found that in some solutions, a common-mode duty cycle of a pulse width modulation (PWM) output is fixed to a relatively small value (e.g., 15%), which can reduce an on time of a switch and an LC charging and discharging time, reduce power loss, and improve efficiency. However, when the audio signal amplitude is relatively large, a common-mode duty cycle of 15% cannot meet an amplitude requirement of signal modulation, and a common-mode reference voltage of an integrator needs to be adjusted by comparing an output signal of the integrator with a direct current reference level, to increase a duty cycle of signal modulation. However, in this manner, a class-D amplifier enters a one-side modulation mode. In the waveforms shown in FIG. 1, only one side of PWM_P and PWM_N toggles. In this case, total harmonic distortion (THD) of the audio signal is relatively poor. Therefore, in this solution, conversion efficiency of the class-D power amplifier is improved. However, entering a single-side pulse width modulation mode may introduce relatively serious signal distortion, which causes poor THD+N performance of a large-signal audio signal. For example, when a signal amplitude is large, the power amplifier enters the single-side modulation mode, which causes audio signal distortion and the like.

To resolve the foregoing problems, in the present disclosure, a common-mode voltage that matches at least one parameter of a signal amplitude and a power supply voltage is generated by a duty cycle signal processing circuit, so that a power amplifier unit can adaptively adjust a PWM common-mode duty cycle based on an audio signal amplitude and the power supply voltage. When the signal amplitude is relatively low or in an idle state, the common-mode duty cycle correspondingly decreases, an on time of a switch is shortened, and a static power loss of an on-state resistor and a power loss of LC charging and discharging are reduced, so that the conversion efficiency is improved, and driving power consumption is reduced, thereby reducing power consumption of the entire audio signal processing device without causing audio signal distortion.

The following describes the technical solutions of the embodiments of the present disclosure clearly and completely with reference to the accompanying drawings. It is clear that the described embodiments are merely some but not all of embodiments of the present disclosure. All other embodiments obtained by those skill in the art based on the embodiments of the present disclosure without creative efforts shall fall within the protection scope of the present disclosure. In a case of no conflict, the following embodiments and their technical features may be mutually combined.

Figure 2:
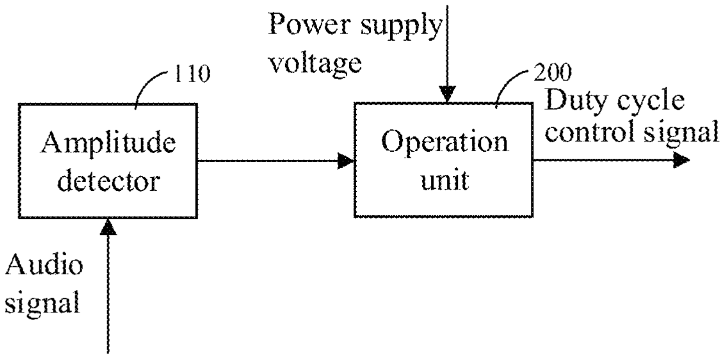
FIG. 2 is a schematic structural diagram of a duty cycle signal processing circuit according to an embodiment of the present disclosure.

A first aspect of the present disclosure provides a duty cycle signal processing circuit. As shown in FIG. 2, the duty cycle signal processing circuit includes an amplitude detector 110 and an operation unit 200. An input terminal of the amplitude detector 110 is connected to an audio signal, an output terminal is connected to a first input terminal of the operation unit 200, a second input terminal of the operation unit 200 is connected to a power supply voltage, and an output terminal outputs a duty cycle control signal.

Specifically, the amplitude detector 110 is configured to detect a first amplitude of an audio signal to generate a second amplitude, and send the second amplitude to the operation unit 200; and the operation unit 200 is configured to obtain a power supply voltage, and perform calculation processing on the second amplitude and the power supply voltage, to obtain a duty cycle control signal that matches at least one parameter of the second amplitude and the power supply voltage, and then a power amplifier unit such as a class-D power amplifier performs a driving operation based on the duty cycle control signal, were the duty cycle control signal matches at least one parameter of the second amplitude and the power supply voltage, so that a common-mode duty cycle in the power amplifier unit can be adaptively adjusted based on at least one parameter of the audio signal amplitude of the and the power supply voltage. When the signal amplitude is relatively low or in an idle state, the common-mode duty cycle correspondingly decreases, a corresponding on time of a switch is shortened, and a static power loss of an on-state resistor and a power loss of LC charging and discharging therein are reduced, so that conversion efficiency of the power amplifier unit can be improved.

In one example, the amplitude detector 110 may perform gain processing on the first amplitude obtained from detecting the first amplitude of the audio signal, to determine the second amplitude. Optionally, that the amplitude detector 110 performs gain processing on the amplitude may include:

Vamp_out=Vamp_in*Gain, where Vamp_out represents the second amplitude, Vamp_in represents the first amplitude, the first amplitude includes an amplitude of an input audio signal, Gain represents a gain parameter, and the symbol * represents multiplication. Optionally, the audio signal includes a digital audio signal, and the amplitude detector 110 may detect a level amplitude of the digital audio signal, to obtain an amplitude of the audio signal.

In an example, the operation unit 200 may include a device such as a comparator and/or a transcoder that can perform operation processing on the second amplitude and the power supply voltage to obtain a required duty cycle control signal. Optionally, expected duty cycle levels may be set in this example. For example, the expected duty cycle levels include 50%, 40%, 30%, 20%, and 10%. In this way, the operation unit 200 may perform operation processing on the second amplitude, the power supply voltage, and duty cycles corresponding to these expected duty cycle levels, to obtain corresponding duty cycles, which can simplify a corresponding operation process and improve stability of the operation process.

In an embodiment, the operation unit is further configured to obtain a theoretical duty cycle according to a preset condition, and determine the duty cycle control signal based on the theoretical duty cycle and the expected duty cycle levels, so that the theoretical duty cycle obtained by using the preset condition matches at least one parameter of the second amplitude and the power supply voltage. Optionally, in this embodiment, the theoretical duty cycle may be rounded up to obtain a corresponding duty cycle signal, or a duty cycle that is greater than or equal to and closest to the theoretical duty cycle may be selected from the expected duty cycle levels as the duty cycle control signal.

Optionally, the preset condition includes an operational formula: DPWM*VSUP=Vamp_out+VHR, where DPWM represents the theoretical duty cycle, VSUP represents the power supply voltage, Vamp_out represents the second amplitude, VHR represents an amplitude margin, and the amplitude margin VHR represents a margin between the maximum allowable signal amplitude in theory set based on the common-mode duty cycle and an actual undistorted maximum signal amplitude, and can be set through configuration or the like, for example, the amplitude can be set to IV (volt), or the like. The foregoing operational formula of the duty cycle control signal may be used by the operation unit 200 to obtain a more accurate duty cycle control signal.

Figure 3A:
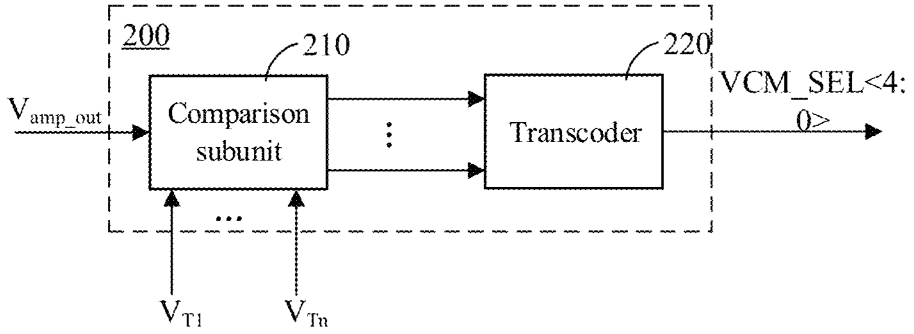
FIG. 3*a* and FIG. 3*b* are schematic structural diagrams of an operation unit according to an embodiment of the present disclosure.
Figure 3B:
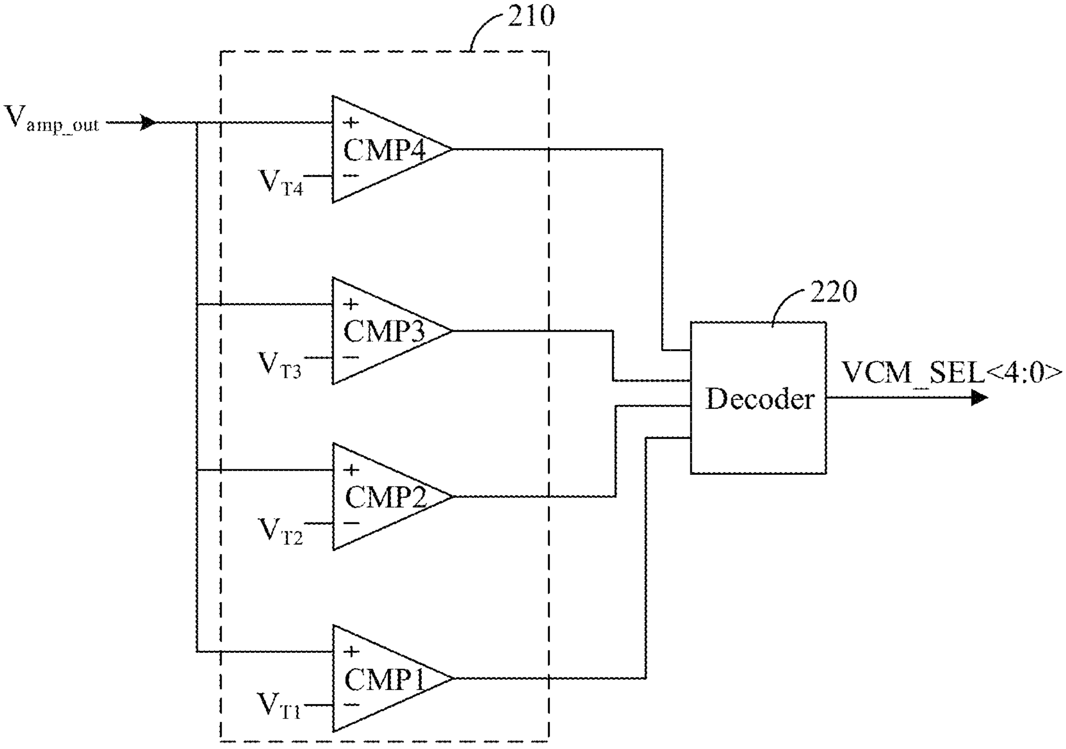

In an embodiment, as shown in FIG. 3*a* and FIG. 3*b*, the operation unit 200 includes a comparison subunit 210 and a transcoder 220. The comparison subunit 210 is configured to compare the second amplitude with each of a plurality of comparison thresholds, and output corresponding comparison results to the transcoder 220. The transcoder 220 is configured to transcode the comparison results, to obtain duty cycle control signals corresponding to the comparison results. The comparison thresholds are determined respectively based on the power supply voltage VSUP, the amplitude margin VHR, and an expected duty cycle level, so that duty cycle control signals corresponding to the comparison results match at least one parameter of the second amplitude and the power supply voltage. Optionally, as shown in FIG. 3*a*, the comparison thresholds may include n thresholds such as VT1 to VTn, and a quantity of comparison thresholds may be determined based on a quantity of duty cycle levels that need to be designed. For example, if N duty cycle levels need to be set for adjustment, N−1 comparison thresholds, N−1 corresponding comparators, and the like may be set.

In an example, as shown in FIG. 3*b*, the comparison subunit 210 includes a first comparator CMP1, a second comparator CMP2, a third comparator CMP3, and a fourth comparator CMP4, and the comparison thresholds include a first threshold VT1, a second threshold VT2, a third threshold VT3, and a fourth threshold VT4. A first input terminal of the first comparator CMP1 is connected to the second amplitude Vamp_out, a second input terminal is connected to the first threshold VT1, and an output terminal is connected to a first input terminal of the transcoder 220; a first input terminal of the second comparator CMP2 is connected to the second amplitude Vamp_out, a second input terminal is connected to the second threshold VT2, and an output terminal is connected to a second input terminal of the transcoder 220; a first input terminal of the third comparator CMP3 is connected to the second amplitude Vamp_out, a second input terminal is connected to the third threshold VT3, and an output terminal is connected to a third input terminal of the transcoder 220; and a first input terminal of the fourth comparator CMP4 is connected to the second amplitude Vamp_out, a second input terminal is connected to the fourth threshold VT4, and an output terminal is connected to the fourth input terminal of the transcoder 220.

Specifically, the expected duty cycles include four levels: a first duty cycle A1, a second duty cycle A2, a third duty cycle A3, and a fourth duty cycle A4. Correspondingly, the first threshold includes: $VT1=A1\times VSUP-VHR$; the second threshold includes: $VT2=A2\times VSUP-VHR$; the third threshold includes: $VT3=A3\times VSUP-VHR$; and the fourth threshold includes: $VT4=A4\times VSUP-VHR$, where VT1 represents the first threshold, A1 represents the first duty cycle, VT2 represents the second threshold, A2 represents the second duty cycle, VT3 represents the third threshold, A3 represents the third duty cycle, VT4 represents the fourth threshold, and A4 represents the fourth duty cycle.

Optionally, the expected duty cycles may further include a level of a fifth duty cycle A5. Values of the first duty cycle A1, the second duty cycle A2, the third duty cycle A3, the fourth duty cycle A4, and the fifth duty cycle A5 may be set based on a modulation requirement of a corresponding power amplifier unit such as a class-D power amplifier. For example, the first duty cycle A1 may be set to 10%, the second duty cycle A2 may be set to 20%, the third duty cycle A3 may be set to 30%, the fourth duty cycle A4 may be set to 40%, and the fifth duty cycle A5 may be set to 50%. In this case, the fourth threshold VT4 represents a determining threshold corresponding to a level of 50%. When $Vamp\_out>VT4$, the level of 50% is selected, and the transcoder 220 outputs a duty cycle control signal (e.g., an indication signal whose duty cycle is 50%) corresponding to 50%. The third threshold VT3 represents a determining threshold corresponding a level of 40%. When $VT4\geq Vamp\_out>VT3$, the level of 40% is selected, and the transcoder 220 outputs a duty cycle control signal corresponding to 40%. The second threshold VT2 represents a determining threshold corresponding to a level of 30%. When $VT3\geq Vamp\_out>VT2$, the level of 30% is selected, and the transcoder 220 outputs a duty cycle control signal corresponding to 30%. The first threshold VT1 represents a determining threshold corresponding to a level of 20%. When $VT2\geq Vamp\_out>VT1$, the level of 20% is selected, the transcoder 220 outputs a duty cycle control signal corresponding to 20%, and when $Vamp\_out\leq VT1$, a level of 10% is selected, and the transcoder 220 outputs a duty cycle control signal corresponding to 10%. Correspondingly, as shown in FIG. 3*b*, duty cycle control signals output by the transcoder 220 may be denoted as VCM_SEL<4:0>, and the VCM_SEL<4:0> includes five levels of duty cycle control signals: VCM_SEL4, VCM_SEL3, VCM_SEL2, VCM_SEL1, and VCM_SEL0.

Figure 4:
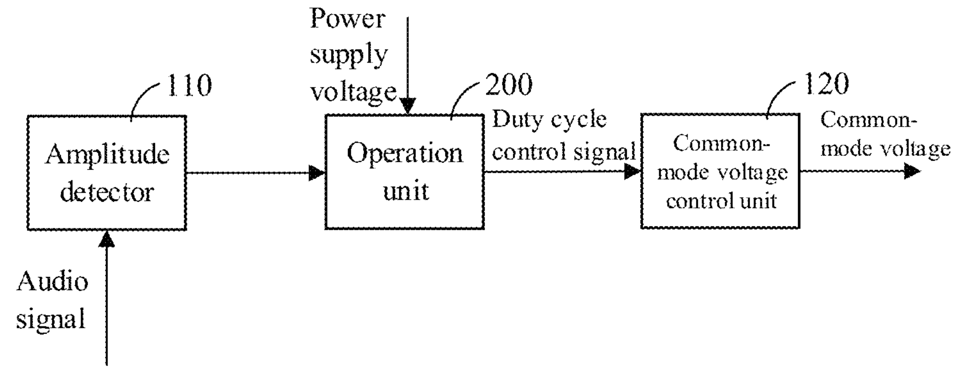
FIG. 4 is a schematic structural diagram of a duty cycle signal processing circuit according to another embodiment of the present disclosure.

In an embodiment, as shown in FIG. 4, the foregoing duty cycle signal processing circuit further includes a common-mode voltage control unit 120. An input terminal of the common-mode voltage control unit 120 is connected to the output terminal of the operation unit 200, and is configured to perform operation processing based on the duty cycle control signal, to obtain a common-mode voltage corresponding to the duty cycle control signal, so as to provide the common-mode voltage to a power amplifier unit such as a class-D power amplifier, and a common-mode duty cycle of the class-D power amplifier unit is adjusted, thereby improving conversion efficiency.

Optionally, the common-mode voltage control unit 120 may include a unit configured to obtain a plurality of levels of voltages, such as a voltage divider subunit, to perform voltage division processing based on factors such as an expected duty cycle level, so as to obtain the common-mode voltage corresponding to the duty cycle control signal.

Figure 5A:
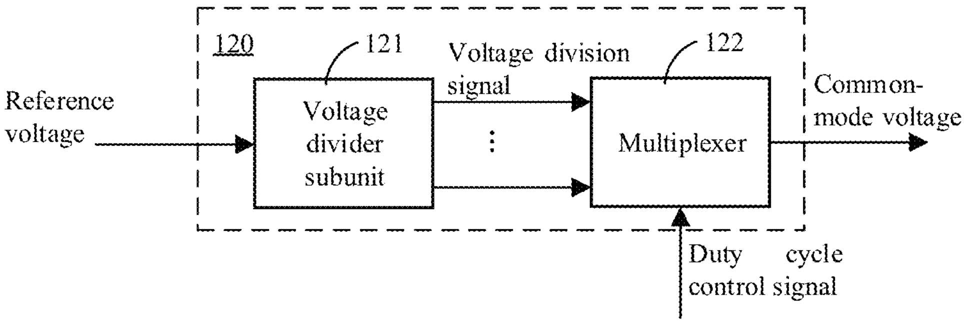
FIG. 5*a* and FIG. 5*b* are schematic structural diagrams of a common-mode voltage control unit according to an embodiment of the present disclosure.
Figure 5B:
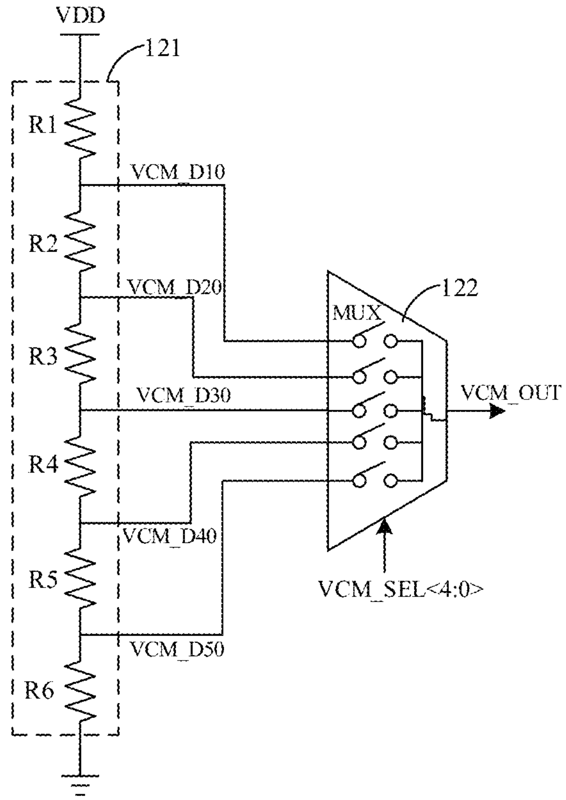

In an example, as shown in FIG. 5*a* and FIG. 5*b*, the common-mode voltage control unit 120 includes a voltage divider subunit 121 and a multiplexer 122. The voltage divider subunit 121 is configured to perform a plurality of times of voltage division processing on a connected reference voltage VDD, to obtain voltage division signals corresponding to the plurality of times of voltage division processing, for example, VCM_D10 to VCM_D50 shown in FIG. 5*b*; and a control terminal of the multiplexer 22 is connected to the duty cycle control signal, and selects a corresponding voltage output channel based on the duty cycle control signal, to output a corresponding common-mode voltage, where the common-mode voltage herein includes a voltage division signal output by the corresponding voltage output channel.

Specifically, as shown in FIG. 5*b*, the voltage divider subunit 121 includes a first resistor R1, a second resistor R2, a third resistor R3, a fourth resistor R4, a fifth resistor R5, and a sixth resistor R6. The voltage division signals include a first signal VCM_D10, a second signal VCM_D20, a third signal VCM_D30, a fourth signal VCM_D40, and a fifth signal VCM_D50. A first terminal of the first resistor R1 is connected to the reference voltage VDD, and a second terminal is separately connected to a first terminal of the second resistor R2 and a first input terminal of the multiplexer 122; a second terminal of the second resistor R2 is separately connected to a first terminal of the third resistor R3 and a second input terminal of the multiplexer 122; a second terminal of the third resistor R3 is separately connected to a first terminal of the fourth resistor R4 and a third input terminal of the multiplexer 122; a second terminal of the fourth resistor R4 is separately connected to a first terminal of the fifth resistor R5 and a fourth input terminal of the multiplexer 122; a second terminal of the fifth resistor R5 is separately connected to a first terminal of the sixth resistor R6 and a fifth input terminal of the multiplexer 122; and a second terminal of the sixth resistor R6 is grounded. The multiplexer 122 may include five voltage output channels, connected to the duty cycle control signals VCM_SEL<4:0>, and corresponding voltage output channels are selected based on the foregoing duty cycle control signals. For example, the multiplexer 122 may: select a first channel when receiving VCM_SEL4, to output the first signal VCM_D10 as a common-mode voltage; select a second channel when receiving VCM_SEL3, to output the second signal VCM_D20 as a common-mode voltage; select a third channel when receiving VCM_SEL2, to output the third signal VCM_D30 as a common-mode voltage; select a fourth channel when receiving VCM_SEL1, to output the fourth signal VCM_D40 as a common-mode voltage; and select a fifth channel when receiving VCM_SEL0, to output the fifth signal VCM_D50 as a common-mode voltage.

Figure 6:
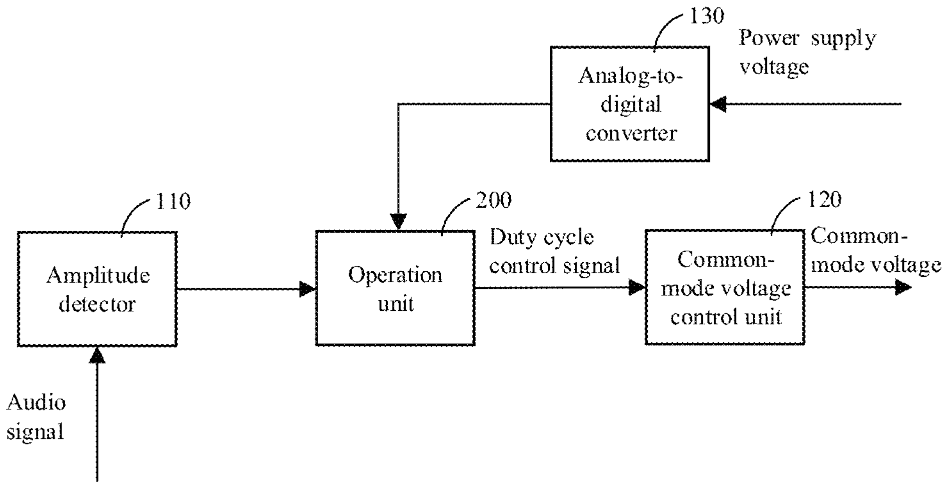
FIG. 6 is a schematic structural diagram of a duty cycle signal processing circuit according to another embodiment of the present disclosure.

In an embodiment, as shown in FIG. 6, the foregoing duty cycle signal processing circuit further includes an analog-to-digital converter 130. The analog-to-digital converter 130 is configured to obtain the power supply voltage, convert the power supply voltage into a digital signal, and then output the converted power supply voltage to the operation unit 200, so that the operation unit 200 performs operation processing based on the power supply voltage in a digital form, thereby improving stability of a processing process.

In the foregoing audio signal processing device, the amplitude detector 110 may send a second amplitude corresponding to an audio signal amplitude to the operation unit 200, so that the operation unit 200 performs operation processing on the second amplitude and a power supply voltage, to obtain a duty cycle control signal that matches at least one parameter of the second amplitude and the power supply voltage, and then a power amplifier unit such as a class-D power amplifier unit performs a driving operation based on the duty cycle control signal, where the duty cycle control signal matches at least one parameter of the second amplitude and the power supply voltage, so that a common-mode duty cycle in the power amplifier unit can be adaptively adjusted based on at least one parameter of the audio signal amplitude and the power supply voltage. When the signal amplitude is relatively low or in an idle state, the common-mode duty cycle correspondingly decreases, a corresponding on time of a switch is shortened, and a static power loss of an on-state resistor and a power loss of LC charging and discharging therein are reduced, so that conversion efficiency of the power amplifier unit can be improved.

Figure 7:
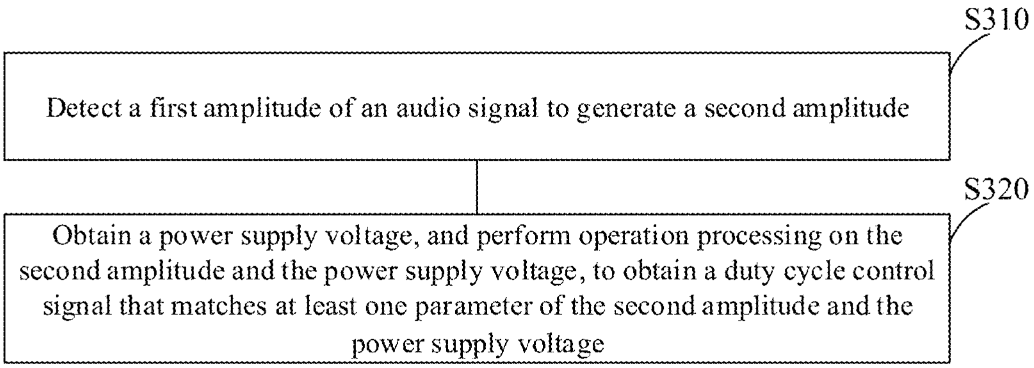
FIG. 7 is a schematic flowchart of a duty cycle signal processing method according to an embodiment of the present disclosure.

A second aspect of the present disclosure provides a duty cycle signal processing method, applied to the duty cycle signal processing circuit in any one of the foregoing embodiments. As shown in FIG. 7, the duty cycle control signal processing method includes S310 and S320.

S310: Detect a first amplitude of an audio signal to generate a second amplitude.

S320: Obtain a power supply voltage, and perform operation processing on the second amplitude and the power supply voltage, to obtain a duty cycle control signal that matches at least one parameter of the second amplitude and the power supply voltage.

In an embodiment, the method of performing operation processing on the second amplitude and the power supply voltage, to obtain a duty cycle control signal that matches at least one parameter of the second amplitude and the power supply voltage further includes: obtaining a theoretical duty cycle according to a preset condition, and determining the duty cycle control signal based on the theoretical duty cycle and an expected duty cycle level.

Optionally, the preset condition includes an operational formula:

$$DPWM*VSUP=V\mathrm{amp\_out}+VHR.$$

Wherein, DPWM represents the theoretical duty cycle, VSUP represents the power supply voltage, Vamp_out represents the second amplitude, and VHR represents an amplitude margin.

In an embodiment, in step S320 shown in FIG. 7, the method of performing operation processing on the second amplitude and the power supply voltage, to obtain a duty cycle control signal that matches at least one parameter of the second amplitude and the power supply voltage further includes:

- comparing the second amplitude with each of a plurality of comparison thresholds, and outputting comparison results to the transcoder, where the comparison thresholds are determined respectively based on the power supply voltage, the amplitude margin, and the duty cycle level, so that duty cycle control signals corresponding to the comparison thresholds match at least one parameter of the second amplitude and the power supply voltage; and
- transcoding the comparison results, to obtain duty cycle control signals corresponding to the comparison results.

In an embodiment, the foregoing duty cycle signal processing method further includes: performing operation processing based on the duty cycle control signal, to obtain a common-mode voltage corresponding to the duty cycle control signal.

The foregoing duty cycle signal processing method is applied to the duty cycle signal processing circuit described in any one of the foregoing embodiments, and has all beneficial effects of the duty cycle signal processing circuit described in any one of the foregoing embodiments. Details are not described herein again.

Figure 8:
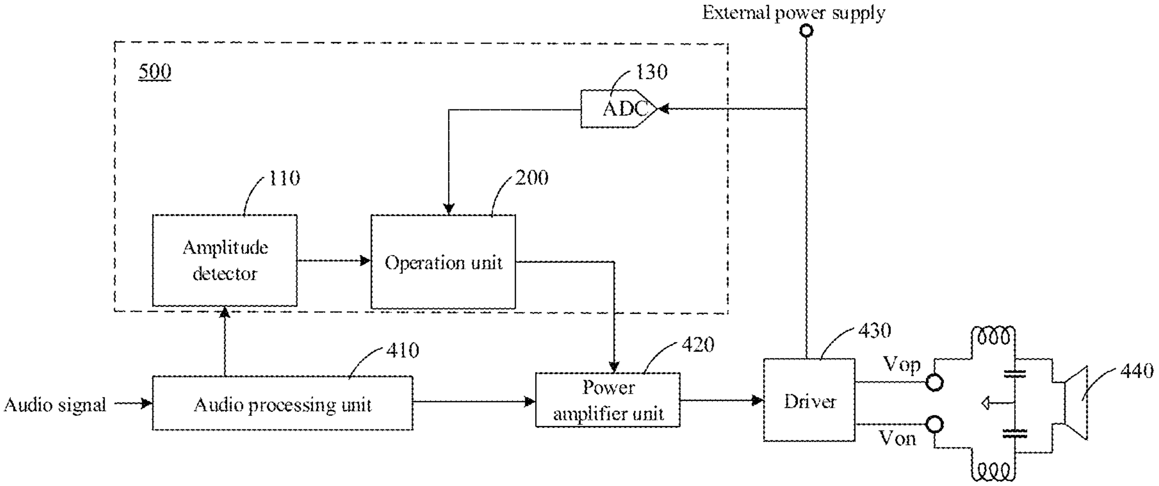
FIG. 8 is a schematic structural diagram of an audio signal processing device according to an embodiment of the present disclosure.

A third aspect of the present disclosure provides an audio signal processing device. As shown in FIG. 8, the audio signal processing device includes an audio processing unit 410, a power amplifier unit 420, a driver 430, and the duty cycle signal processing circuit 500 described in any one of the foregoing embodiments, where

- the audio processing unit 410 is configured to perform first modulation processing on a connected audio signal to obtain a first modulation signal, and send the first modulation signal to the power amplifier unit 420;
- the power amplifier unit 420 is configured to receive the first modulation signal and a common-mode voltage that is output by the duty cycle signal processing circuit 500, perform second modulation processing on the common-mode voltage based on the first modulation signal to obtain a second modulation signal, and send the second modulation signal to the driver 430; and
- the driver 430 is configured to drive a corresponding play component 440 based on the second modulation signal to play the audio signal.

Optionally, the audio processing unit 410 may include a component configured to transmit and modulate an audio signal, such as a DSM modulator. The power amplifier unit 420 may include a class-D power amplifier. Optionally, the driver 430 and the analog-to-digital converter 130 in the duty cycle signal processing circuit 500 are further connected to an external power supply, and a voltage of the external power supply is a power supply voltage VSUP.

The foregoing audio signal processing device uses the duty cycle signal processing circuit 500 described in any one of the foregoing embodiments to generate a common-mode voltage, and the power amplifier unit 420 performs second modulation processing, so that the power amplifier unit 420 can adaptively adjust a PWM common-mode duty cycle based on the audio signal amplitude and the power supply voltage. When the signal amplitude is relatively low or in an idle state, the common-mode duty cycle correspondingly decreases, an on time of a switch is shortened, and a static power loss of an on-state resistor and a power loss of LC charging and discharging are reduced, so that conversion efficiency is improved.

Figure 9:
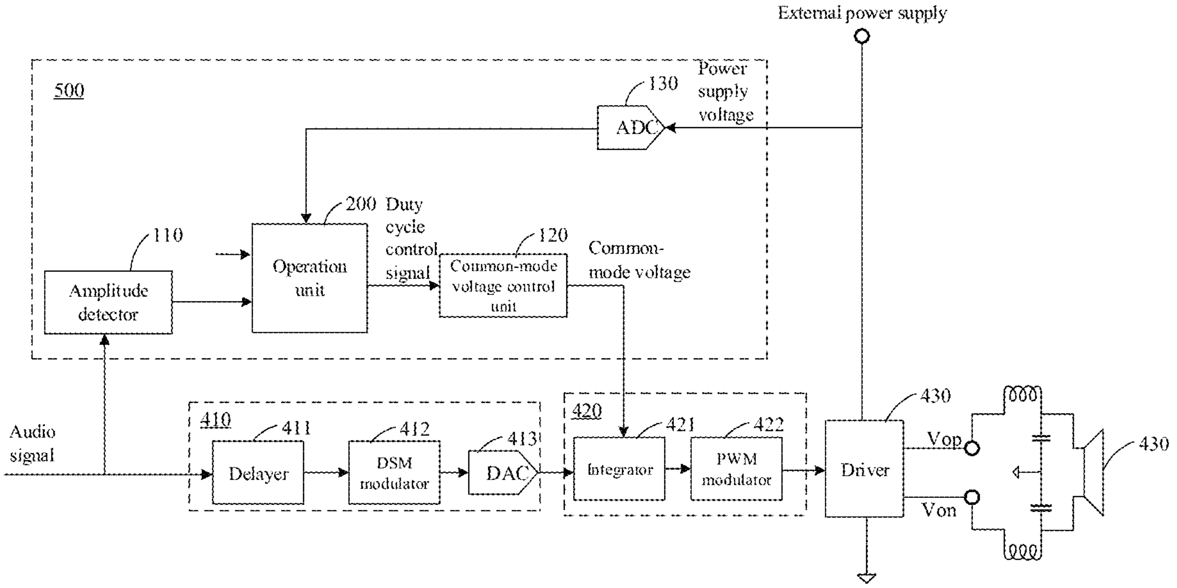
FIG. 9 is a schematic structural diagram of an audio signal processing device according to another embodiment of the present disclosure.

In an embodiment, as shown in FIG. 9, the audio processing unit 410 includes a delayer 411, a DSM modulator (triangular integral modulator) 412, and a digital-to-analog converter 413. An input terminal of the delayer 411 is connected to an audio signal that may include a digital audio signal, and an output terminal is connected to the analog-to-digital converter 413 through the DSM modulator 412.

The delayer 411 is configured to perform delay processing on the audio signal, and output a delayed audio signal to the DSM modulator 412; the DSM modulator 412 is configured to perform DSM modulation on the delayed audio signal, to output an initial modulation signal; and the analog-to-digital converter 413 is configured to perform digital-to-analog conversion on the initial modulation signal, to output the first modulation signal. Optionally, a delay time of the delayer 411 may be set based on a factor such as a response characteristic of the audio signal, for example, may be set to 1 ms (millisecond), or the like. The delayer 411 performs delay processing on the audio signal, so that the duty cycle control signal in the duty cycle signal processing circuit 500 preemptively addresses the accuracy of the audio signal and/or the power supply voltage, thereby improving a corresponding modulation effect.

In an embodiment, as shown in FIG. 9, the power amplifier unit includes a PWM modulator 422. The PWM modulator 422 is configured to perform second modulation processing on the common-mode voltage to obtain a second modulation signal, and output the second modulation signal to the driver 430. Optionally, as shown in FIG. 9, if the power amplifier unit includes an integrator 421, the PWM modulator 422 may be connected between the integrator 421 and the driver 430. If the power amplifier unit does not include the integrator 421, the PWM modulator 422 may be connected between the audio processing unit 410 (e.g., the analog-to-digital converter 413) and the driver 430. In this case, one input terminal of the PWM modulator 422 may further be connected to an output terminal of the duty cycle signal processing circuit 500 (e.g., a common-mode voltage control unit 120).

Optionally, as shown in FIG. 9, the power amplifier unit 420 further includes an integrator 421. The integrator 421 is configured to receive the first modulation signal and the common-mode voltage, perform filtering processing on the common-mode voltage based on the first modulation signal, and output a filtered common-mode voltage to the PWM modulator 422, so that the PWM modulator 422 generates a corresponding control waveform based on the common-mode voltage, and the driver 430 performs a driving operation based on the control waveform.

In one example, the audio signal processing device further includes a play component 440. The play component 440 is connected to an output of the driver 430, to play a corresponding audio signal under the driving of the driver 430. Optionally, the play component 440 may include a component configured to play an audio signal, such as a speaker.

Figure 10A:
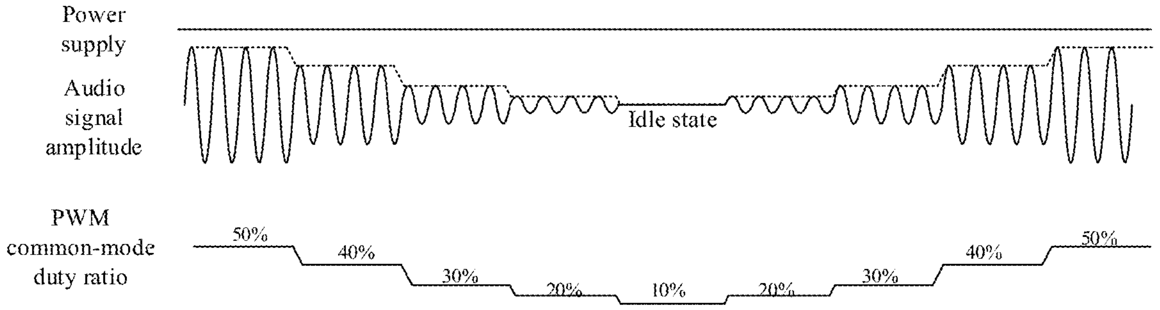
FIG. 10*a*, FIG. 10*b*, and FIG. 10*c* are schematic diagrams of waveform analysis according to an embodiment of the present disclosure.
Figure 10B:
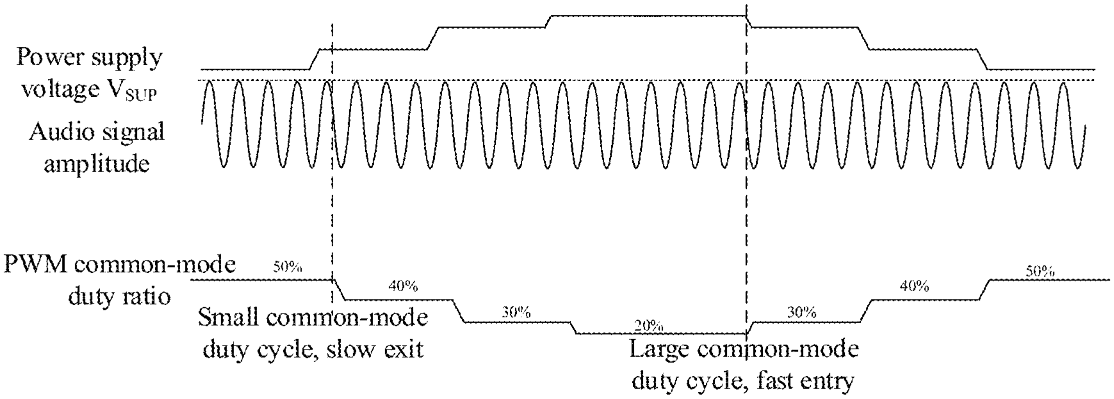
Figure 10C:
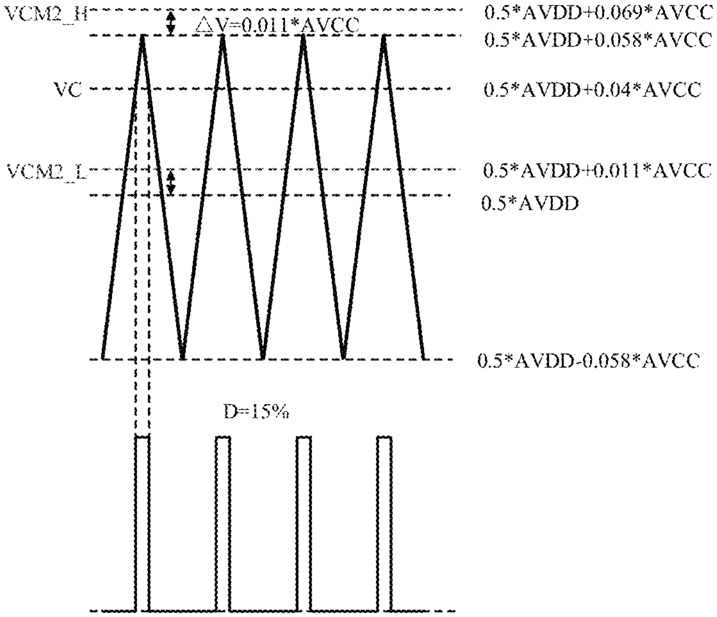

In an example, the inventor analyzes an operating process of the PWM modulator 422 in the power amplifier unit 420, and find that the PWM modulator 422 performs second modulation processing to generate a control waveform, and the control waveform includes a PWM common-mode duty cycle. If the power supply voltage is unchanged, a change feature of the PWM common-mode duty cycle with an audio signal amplitude may be shown in FIG. 10*a*. It may be learned from FIG. 10*a* that the power supply voltage remains unchanged, and when a level (amplitude) of an input audio signal is relatively high, the PWM common-mode duty cycle keeps at 50%; and when the level of the audio signal becomes low, the common-mode duty cycle gradually decreases (for example, successively changes to 40%, 30%, 20%, and 10%); and when an input is idle, an output duty cycle remains at 10%. If the audio signal amplitude is unchanged, a change feature of the PWM common-mode duty cycle with the power supply voltage may be shown in FIG. 10*b*. It may be learned from FIG. 10*b* that, when the audio signal amplitude remains unchanged, the power supply voltage increases, and the PWM common-mode duty cycle correspondingly decreases; and the power supply voltage decreases, and the PWM common-mode duty cycle correspondingly increases. In particular, as shown in FIG. 10*b*, when it is detected that the power supply voltage increases, the common-mode duty cycle decreases only after a specific delay, which reflects that the duty cycle control signal generated by the foregoing duty cycle signal processing circuit 500 can provide a slow exit function; and when it is detected that the power supply voltage decreases, the PWM common-mode duty cycle rapidly increases, and the duty cycle control signal generated by the foregoing duty cycle signal processing circuit 500 can provide a fast entry function. As shown in FIG. 10*a*, when it is detected that the level of the audio signal decreases, the common-mode duty cycle decreases only after a specific delay, which reflects that the duty cycle control signal generated by the foregoing duty cycle signal processing circuit 500 can provide a slow exit function; and when it is detected that the level of the audio signal increases, the PWM common-mode duty cycle rapidly increases, and the duty cycle control signal generated by the foregoing duty cycle signal processing circuit 500 can provide a fast entry function. The inventor further studied a conventional PWM modulation process, and found that a common mode of a triangular wave of conventional PWM modulation is the same as a common mode of an input audio signal, for example, 0.5 AVDD. Therefore, a common-mode duty cycle of an output signal is usually 50%. To change an output common-mode signal duty cycle, a direct current reference level of a signal must be changed. As shown in FIG. 10*c*, when a corresponding common-mode voltage VC increases, a static output signal duty cycle significantly decreases, where a triangular wave amplitude VOSC=0.5*AVDD±0.058*AVCC, and a common-mode output signal duty cycle D is:

$$D = \frac{V_{OSC\_H} - VC}{V_{OSC\_H} - V_{OSC\_L}} \times 100\%.$$

$V_{OSC\_H}$ represents a highest value of the triangular wave amplitude VOSC, and $V_{OSC\_L}$ represents a lowest value of the triangular wave amplitude VOSC. The above formula provides a relationship between a static output signal duty cycle and a direct current reference level. A generation circuit of the direct current reference level is as follows. In the figure, VH and VL are peak values of the triangular wave. The op-amp clamps ½*AVDD as an intermediate value of VH and VL. An integrator common-mode level corresponding to 10%, 20%, 30%, 40%, and 50% is obtained through resistor voltage division. However, the audio processing device provided in the present disclosure can monitor an audio signal amplitude and a power supply voltage value by using an adaptive duty cycle modulation technology, and determine a proportional relationship between the signal and the power supply voltage through a correlation operation, to infer the maximum direct current reference voltage that ensures a signal voltage does not exceed a power supply level. After comparison and analysis, the inventor finds that the audio processing device using the duty cycle signal processing circuit 500 described in any one of the foregoing embodiments has the following advantages:

1. A common-mode duty cycle output by a power amplifier is adaptively adjusted based on an audio signal amplitude and a power supply voltage, to reduce a power loss of switching on or off resistors and a power loss of LC charging and discharging, and improve efficiency of a power amplifier, without causing audio signal distortion. 2. The audio signal amplitude is detected in advance, an output audio signal can be predicted, and when it is predicted that the audio signal amplitude increases, the common-mode duty cycle may be adjusted to a corresponding level in advance. 3. A current power supply voltage of the power amplifier is detected, and the power supply voltage is used as a reference value for adjusting the common-mode duty cycle, to adapt to a wide range of power supply voltage changes. 4. The common-mode duty cycle is controlled to adjust slowly, to prevent an audio signal abnormality caused by large sudden switching of the common-mode duty cycle. 5. A comparison threshold can be flexibly configured.

In the foregoing audio signal processing device, the duty cycle signal processing circuit 500 generates a common-mode voltage that matches at least one parameter of a signal amplitude and a power supply voltage, and the power amplifier unit 420 can adaptively adjust the PWM common-mode duty cycle based on an audio signal amplitude and the power supply voltage. When the signal amplitude is relatively low or in an idle state, the common-mode duty cycle correspondingly decreases, an on time of a switch is shortened, and a static power loss of an on-state resistor and a power loss of LC charging and discharging are reduced, so that the conversion efficiency is improved, and driving power consumption is reduced, thereby reducing power consumption of the entire audio signal processing device.

Although the present disclosure has been shown and described with respect to one or more implementations, equivalent variations and modifications will be contemplated by those skilled in the art based on reading and understanding this specification and the accompanying drawings. the present disclosure includes all such modifications and variations, and is limited only by the scope of the appended claims. In particular, with respect to various functions performed by the above-mentioned components, terms used to describe such components are intended to correspond to any component (unless otherwise indicated) executing specified functions of the components (e.g., functionally equivalent), even if structurally not identical to the disclosed structures executing the functions in the exemplary implementations of the specification shown herein.

That is, the foregoing descriptions are merely embodiments of the present disclosure, and are not intended to limit the patent scope of the present disclosure. Any equivalent structure or equivalent process transformation made by using content in the specification and accompanying drawings of the present disclosure, such as mutual combinations of technical features between embodiments or direct or indirect application in other related technical fields, is included in the patent protection scope of the present disclosure.

In addition, terms “first” and “second” are used only for description purposes, and cannot be understood as an indication or an implication of relative importance or as an implicit indication of a quantity of indicated technical features. Therefore, a feature defined with “first” or “second” may explicitly or implicitly include one or more features. In the description of the present disclosure, “a plurality of” means two or more, unless otherwise specified.

To enable any person skilled in the art to implement and use the present disclosure, the foregoing descriptions are provided in the present disclosure. In the foregoing descriptions, details are listed for purposes of explanation. It should be understood that those of ordinary skill in the art may recognize that the present disclosure may also be implemented without using these specific details. In other embodiments, well-known processes are not described in detail, to avoid obscuring the description of the present disclosure with unnecessary details. Therefore, the present disclosure is not intended to be limited to the illustrated embodiments, but is consistent with the widest scope consistent with the principles and features disclosed in the present disclosure.

The invention claimed is:

1. A duty cycle signal processing circuit, comprising an amplitude detector and an operation unit, wherein the amplitude detector is configured to detect a first amplitude of an audio signal, generate a second amplitude, and send the second amplitude to the operation unit; and the operation unit is configured to obtain a power supply voltage, and perform operation processing on the second amplitude and the power supply voltage, to obtain a duty cycle control signal that matches at least one parameter of the second amplitude and the power supply voltage.

2. The duty cycle signal processing circuit according to claim 1, wherein the operation unit obtains a theoretical duty cycle according to a preset condition, and determines the duty cycle control signal based on the theoretical duty cycle and an expected duty cycle level.

3. The duty cycle signal processing circuit according to claim 2, wherein the preset condition comprises an operational formula:

$$DPWM*VSUP=V\text{amp\_out}+VHR, \text{ wherein}$$

DPWM represents the theoretical duty cycle, VSUP represents the power supply voltage, Vamp_out represents the second amplitude, and VHR represents an amplitude margin.

4. The duty cycle signal processing circuit according to claim 3, wherein the operation unit comprises a comparison subunit and a transcoder, wherein the comparison subunit is configured to compare the second amplitude with each of a plurality of comparison thresholds, and output comparison results to the transcoder, wherein the comparison thresholds are determined respectively based on the power supply voltage, the amplitude margin, and the duty cycle level, so that duty cycle control signals corresponding to the comparison thresholds match at least one parameter of the second amplitude and the power supply voltage; and the transcoder is configured to transcode the comparison results, to obtain duty cycle control signals corresponding to the comparison results.

5. The duty cycle signal processing circuit according to claim 4, wherein the comparison subunit comprises a first comparator, a second comparator, a third comparator, and a fourth comparator, and the comparison thresholds comprise a first threshold, a second threshold, a third threshold, and a fourth threshold, wherein a first input terminal of the first comparator is configured to receive the second amplitude, a second input terminal of the first comparator is configured to receive the first threshold, and an output terminal of the first comparator is connected to a first input terminal of the transcoder;

a first input terminal of the second comparator is configured to receive the second amplitude, a second input terminal of the second comparator is configured to receive the second threshold, and an output terminal of the second comparator is connected to a second input terminal of the transcoder;

a first input terminal of the third comparator is configured to receive the second amplitude, a second input terminal of the third comparator is configured to receive the third threshold, and an output terminal of the third comparator is connected to a third input terminal of the transcoder; and a first input terminal of the fourth comparator is configured to receive the second amplitude, a second input terminal of the fourth comparator is configured to receive the fourth threshold, and an output terminal of the fourth comparator is connected to the fourth input terminal of the transcoder.

6. The duty cycle signal processing circuit according to claim 5, wherein the expected duty cycle level comprises a first duty cycle, a second duty cycle, a third duty cycle, and a fourth duty cycle;

the first threshold comprises: VT1=A1×VSUP−VHR;

the second threshold comprises: VT2=A2×VSUP−VHR;

the third threshold comprises: VT3=A3×VSUP−VHR; and the fourth threshold comprises: VT4=A4×VSUP−VHR, wherein VT1 represents the first threshold, A1 represents the first duty cycle, VT2 represents the second threshold, A2 represents the second duty cycle, VT3 represents the third threshold, A3 represents the third duty cycle, VT4 represents the fourth threshold, and A4 represents the fourth duty cycle.

7. The duty cycle signal processing circuit according to claim 1, further comprising a common-mode voltage control unit, wherein an input terminal of the common-mode voltage control unit is connected to an output terminal of the operation unit, and is configured to perform operation processing based on the duty cycle control signal, to obtain a common-mode voltage corresponding to the duty cycle control signal.

8. The duty cycle signal processing circuit according to claim 7, wherein the common-mode voltage control unit comprises a voltage divider subunit and a multiplexer, wherein the voltage divider subunit is configured to perform a plurality of times of voltage division processing on a connected reference voltage, to obtain voltage division signals corresponding to the plurality of times of voltage division processing; and a control terminal of the multiplexer is configured to receive the duty cycle control signal, and selects a corresponding voltage output channel based on the duty cycle control signal, to output a corresponding common-mode voltage.

9. The duty cycle signal processing circuit according to claim 8, wherein the voltage divider subunit comprises a first resistor, a second resistor, a third resistor, a fourth resistor, a fifth resistor, and a sixth resistor, wherein a first terminal of the first resistor is configured to receive the reference voltage, and a second terminal of the first resistor is separately connected to a first terminal of the second resistor and a first input terminal of the multiplexer; a second terminal of the second resistor is separately connected to a first terminal of the third resistor and a second input terminal of the multiplexer; a second terminal of the third resistor is separately connected to a first terminal of the fourth resistor and a third input terminal of the multiplexer; a second terminal of the fourth resistor is separately connected to a first terminal of the fifth resistor and a fourth input terminal of the multiplexer; a second terminal of the fifth resistor is separately connected to a first terminal of the sixth resistor and a fifth input terminal of the multiplexer; and a second terminal of the sixth resistor is grounded.

10. The duty cycle signal processing circuit according to claim 1, further comprising an analog-to-digital converter, wherein the analog-to-digital converter is configured to obtain the power supply voltage, convert the power supply voltage into a digital signal, and then output the converted power supply voltage to the operation unit.

11. A duty cycle signal processing method, applied to the duty cycle signal processing circuit according to claim 1, comprising:

detecting a first amplitude of an audio signal, to generate a second amplitude; and obtaining a power supply voltage, and performing operation processing on the second amplitude and the power supply voltage, to obtain a duty cycle control signal that matches at least one parameter of the second amplitude and the power supply voltage.

12. The duty cycle signal processing method according to claim 11, wherein the method of performing operation processing on the second amplitude and the power supply voltage, to obtain a duty cycle control signal that matches at least one parameter of the second amplitude and the power supply voltage further comprises:

obtaining a theoretical duty cycle according to a preset condition, and determining the duty cycle control signal based on the theoretical duty cycle and an expected duty cycle level, wherein the preset condition is used to represent a relationship between the theoretical duty cycle, the power supply voltage, and the second amplitude.

13. The duty cycle signal processing method according to claim 12, wherein the preset condition comprises an operational formula:

$$DPWM*VSUP=V\mathrm{amp\_out}+VHR,$$

wherein DPWM represents the theoretical duty cycle, VSUP represents the power supply voltage, Vamp_out represents the second amplitude, and VHR represents an amplitude margin.

14. The duty cycle signal processing method according to claim 13, wherein the method of performing operation processing on the second amplitude and the power supply voltage, to obtain a duty cycle control signal that matches at least one parameter of the second amplitude and the power supply voltage further comprises:

comparing the second amplitude with each of a plurality of comparison thresholds, and outputting comparison results to a transcoder, wherein the comparison thresholds are determined respectively based on the power supply voltage, the amplitude margin, and the duty cycle level, so that duty cycle control signals corresponding to the comparison thresholds match at least one parameter of the second amplitude and the power supply voltage; and transcoding the comparison results, to obtain duty cycle control signals corresponding to the comparison results.

15. The duty cycle signal processing method according to claim 11, further comprising:

performing operation processing based on the duty cycle control signal, to obtain a common-mode voltage corresponding to the duty cycle control signal.

16. An audio signal processing device, comprising an audio processing unit, a power amplifier unit, a driver, and the duty cycle signal processing circuit according to claim 1, wherein the audio processing unit is configured to perform first modulation processing on a received audio signal to obtain a first modulation signal, and send the first modulation signal to the power amplifier unit;

the power amplifier unit is configured to receive the first modulation signal and a common-mode voltage that is output by the duty cycle signal processing circuit, perform second modulation processing on the common-mode voltage based on the first modulation signal to obtain a second modulation signal, and send the second modulation signal to the driver; and the driver is configured to drive a corresponding play component based on the second modulation signal to play the audio signal.

17. The audio signal processing device according to claim 16, wherein the audio processing unit comprises a delayer, a DSM modulator, and a digital-to-analog converter, wherein the delayer is configured to perform delay processing on the audio signal, and output a delayed audio signal to the DSM modulator;

the DSM modulator is configured to perform DSM modulation on the delayed audio signal, to output an initial modulation signal; and the digital-to-analog converter is configured to perform digital-to-analog conversion on the initial modulation signal, to output the first modulation signal.

18. The audio signal processing device according to claim 16, wherein the power amplifier unit comprises a PWM modulator; and the PWM modulator is configured to perform the second modulation processing on the common-mode voltage, to obtain the second modulation signal.

19. The audio signal processing device according to claim 18, wherein the power amplifier unit further comprises an integrator; and the integrator is configured to receive the first modulation signal and the common-mode voltage, perform filtering processing on the common-mode voltage based on the first modulation signal, and output a filtered common-mode voltage to the PWM modulator.

20. The audio signal processing device according to claim 16, further comprising the play component, wherein the play component is connected to an output terminal of the driver.

* * * * *